United States Patent [19]
Ayd et al.

[11] Patent Number: 6,137,684
[45] Date of Patent: Oct. 24, 2000

[54] CAMMING MECHANISM FOR JOINING MODULAR ELECTRONIC ENCLOSURES

[75] Inventors: David N. Ayd, Pleasant Valley; Richard M. Ecker, Poughkeepsie, both of N.Y.; Timothy S. Farrow, Apex, N.C.; Franz Edlinger, Margaretville; Peter W. Kelly, Stone Ridge, both of N.Y.

[73] Assignee: International Business Machines Corporation, Armonk, N.Y.

[21] Appl. No.: 09/063,836

[22] Filed: Apr. 21, 1998

[51] Int. Cl.$^7$ ........................................ H05K 7/20
[52] U.S. Cl. .................... 361/727; 361/608; 361/610; 361/685; 361/687
[58] Field of Search .................... 361/727, 608, 361/610, 683–687

[56] References Cited

U.S. PATENT DOCUMENTS

| | | | |
|---|---|---|---|
| 4,453,754 | 6/1984 | Kelly | 294/15 |
| 4,977,532 | 12/1990 | Borkowicz et al. | 364/708 |
| 5,077,722 | 12/1991 | Geist et al. | 369/75 |
| 5,694,290 | 12/1997 | Chang | 361/685 |
| 6,018,458 | 1/2000 | Delia et al. | 361/690 |
| 6,025,989 | 2/2000 | Ayd et al. | 361/695 |

Primary Examiner—Leo P. Picard
Assistant Examiner—Hung Van Duong
Attorney, Agent, or Firm—Floyd A. Gonzales

[57] ABSTRACT

An electronic enclosure assembly having a logic chassis, a forward extension member attached to one end of the logic chassis wherein each side of the forward extension member has side pieces, each of the side pieces having a face and a notch. The enclosure further includes a removable chassis having a front side and a rearward side and sized to fit between the side pieces and slidably movable on the extension until it is engaged with the logic chassis. An activation handle having side members is pivotally attached on the sides and at front end of the removable chassis and is movable between an up position and a down position. The ends of the side members and the notches of the side pieces of the logic chassis cooperate for camming the removable chassis into engagement with the logic chassis when the activation handle is moved to its up position and for camming the removable chassis away and disengaging the removable chassis from the logic chassis when said activation handle is returned to its down position. The logic chassis and removable chassis include connectors which are plugged and unplugged together when the chassis are engaged and disengaged, respectively. Alignment means are provided to align the chassis in the vertical and horizontal directions.

9 Claims, 6 Drawing Sheets

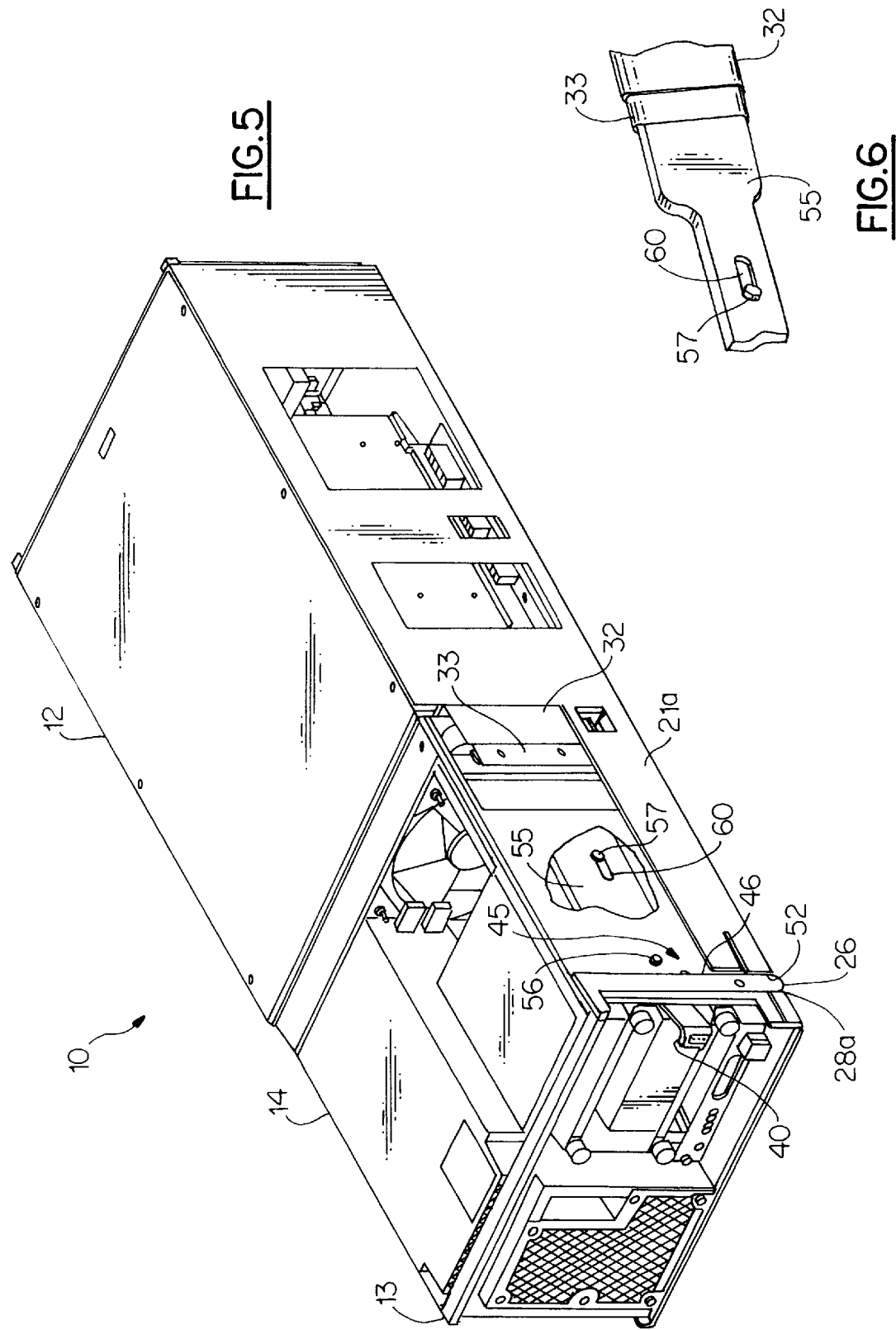

ic components such as disk drives, tape drives, DASD, and the like which require a higher level of serviceability than the components of the logic chassis 12.

CAMMING MECHANISM FOR JOINING MODULAR ELECTRONIC ENCLOSURES

The present invention is related to a camming mechanism, and is more particularly related to a camming mechanism for joining modular electronic enclosures.

BACKGROUND OF THE INVENTION

Modular electronic assemblies are known in which one assembly is plugged into or seated within another to form a module. Many of the assemblies require separate tools to separate one assembly from the other, or to seat one assembly within the other. Many assemblies do not provide a mechanism giving a mechanical advantage to seat one assembly within the other, but rather rely on the assembler to provide the force necessary to seat one assembly within the other.

U.S. Pat. No. 4,453,754 issued Jun. 12, 1984 to Kelly for ELECTRONIC PLUG-IN MODULE EXTRACTOR discloses an extracting tool for removing an electronic plug-in module from a chassis assembly.

U.S. Pat. No. 4,977,532 issued Dec. 11, 1990 to Borkowiez et al. for INDUSTRIAL COMPUTER SYSTEM WITH REMOVABLE EQUIPMENT DRAWER discloses a computer system in a cabinet in which the computer cards, disk drives and power supply of the computer are mounted in a drawer assembly that is removable from the rear of the cabinet.

U.S. Pat. No. 5,077,722 issued Dec. 31, 1991 to Geist et al. for DISK DRIVE INSERTION AND REMOVAL INTERLOCK discloses an interlock for a disk drive unit having a handle and a camming arrangement responsive to pivotal movements for inserting and withdrawing the unit from a housing fixture.

SUMMARY OF THE INVENTION

An electronic enclosure assembly is disclosed having a logic chassis, a forward extension member attached to one end of the logic chassis wherein each side of the forward extension member has side pieces, each of the side pieces having a face and a notch. The enclosure further includes a removable chassis having a front side and a rearward side and sized to fit between the side pieces and slidably movable on the extension until it is engaged with the logic chassis. An activation handle having side members is pivotally attached on the sides and at front end of the removable chassis and is movable between an up position and a down position. The ends of the side members and the notches of the side pieces of the logic chassis cooperate for camming the removable chassis into engagement with the logic chassis when the activation handle is moved to its up position and for camming the removable chassis away and disengaging the removable chassis from the logic chassis when said activation handle is returned to its down position. The logic chassis and removable chassis include connectors which are plugged and unplugged together when the chassis are engaged and disengaged, respectively. Alignment means are provided to align the chassis in the vertical and horizontal directions.

A primary object of the present invention is to provide a camming mechanism for camming a removable chassis into a logic module of a node module for use in a rack mounted computer assembly.

It is another object of the present invention to provide a camming mechanism which as a smaller side-to-side profile wherein the movable cam surface lies in the same plane as the stationary enclosure's side wall.

It is another object of the present invention to provide a notch in the stationary wall as the stationary cam surface.

It is another object of the present invention to provide a camming mechanism having a narrow side-to-side profile and a narrow profile of depth into the node module with an integral cam and cam handle geometry.

It is another object of the present invention to provide a camming mechanism for providing the specific forces and cam travel distances needed to fully seat a removable chassis in a logic chassis, and to incorporate a solid stop before the camming action begins.

It is another object of the present invention to provide a camming mechanism which provides an alignment mechanism which aligns the removable chassis in the logic chassis in both the horizontal and vertical directions as the removable chassis is inserted into the logic chassis.

It is another object of the present invention to provide a camming mechanism having a friction button to hold the actuation handle in its up position, thereby preventing vibration or slight movement from moving the camming mechanism once the removable chassis is seated in the logic chassis.

The foregoing and other objects, features and advantages of the invention will be apparent from the following more particular description of the preferred embodiment of the invention as illustrated in the drawings.

BRIEF DESCRIPTION OF THE DRAWINGS

FIG. 5 is a perspective view of the node module of FIG. 1 wherein the actuating handle is in its up position, with the removable chassis fully seated in the logic module;

FIG. 6 is partial view of a yoke member of the node module of FIG. 1, the yoke member for plugging one of the connector halves of the removable chassis fully into its mating connector half in the logic chassis.

DESCRIPTION OF THE PREFERRED EMBODIMENT

Figure 1:
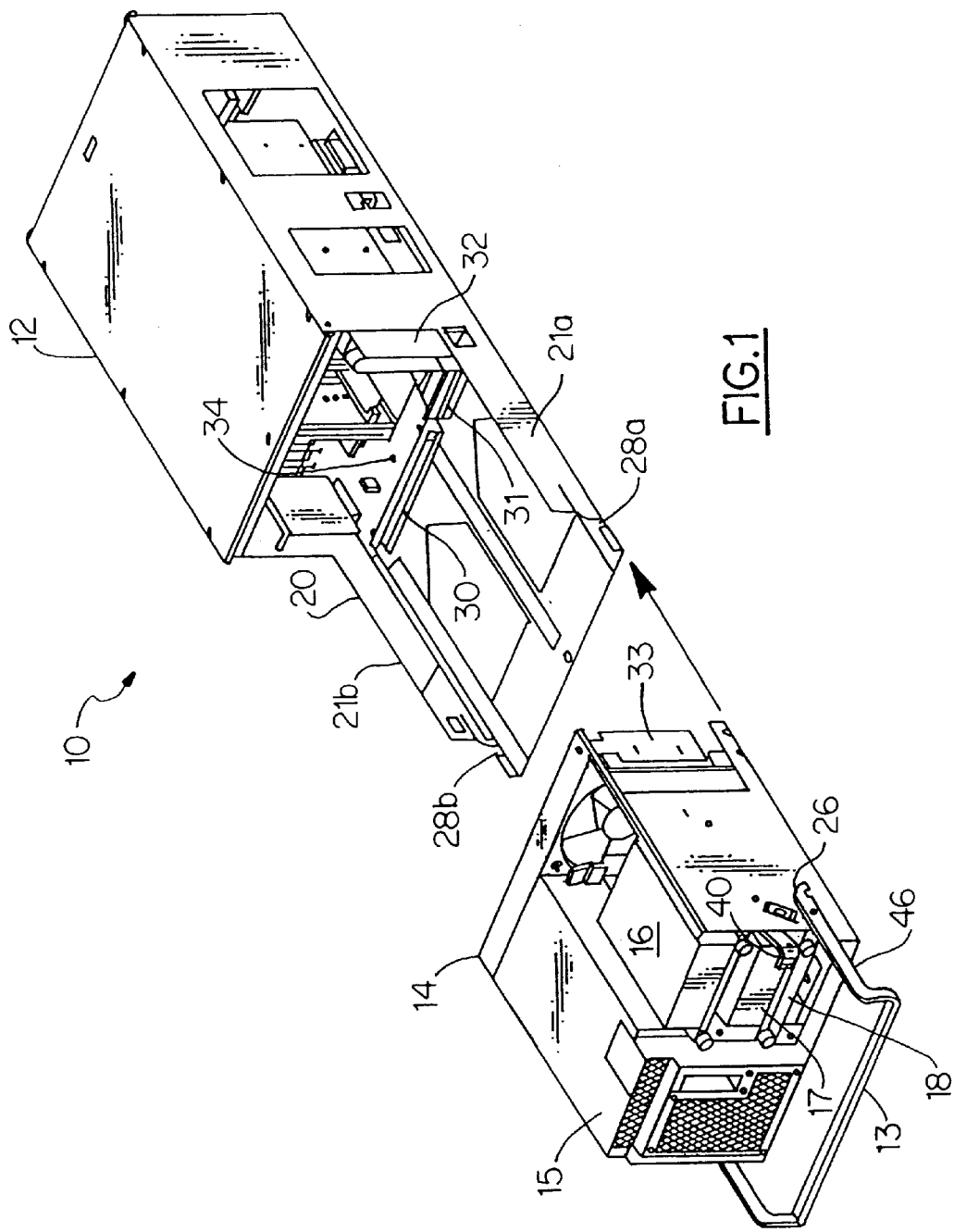
FIG. 1 is a perspective view of a node module for the present invention, the node module having a logic module for containing logic electronics, and a removable chassis for holding components having a higher requirement for serviceability access.

FIG. 1 is a perspective view of a node module 10 having a logic chassis 12 and a removable chassis 14. The logic chassis 12 includes electronic components such as memory cards, CPU cards, I/O cards, and a service processor card, all connected to a motherboard, as is well known in the computer art. The removable chassis 14 includes non-logic support hardware such as a power supply 15, a pair of disk drives 16 and 17, and a supervisor card 18.

In one embodiment, the present invention is incorporated in a computer having a modular enclosure assembled in accordance with U.S. patent application Ser. No. 09/063,990 to Ayd et al. for MODULAR NODE ASSEMBLY FOR RACK MOUNTED MULTIPROCESSOR COMPUTER (Attorney Docket No. (PO9-97-160), now U.S. Pat. No. 6,025,989; the chassis of the computer enclosure are slidably engageable in accordance with U.S. patent application Ser. No. 09/063,989 to Ecker el al. for ABRASION CONTROL ON SLIDING ASSEMBLIES (Attorney Docket No. PO9-98-059), now U.S. Pat. No. 5,992,957; cooling air is distributed in the enclosure in accordance with U.S. patent application Ser. No. 09/063,850 to Delia et al. for CONSTANT IMPEDANCE AIR BAFFLE FOR COOLING OF ELECTRONIC CARD ASSEMBLIES (Attorney Docket No. PO9-97-161), now U.S. Pat. No. 6,018,458; and the tailgate of the computer is constructed in accordance with U.S. patent application Ser. No. 09/063,991 to Ecker el al. for EXPANSION SLOT ALIGNMENT PINS (Attorney Docket No. PO9-98-076), now U.S. Pat. No. 6,058,025, all of which are owned by the assignee of the present invention and incorporated herein by reference.

The logic chassis 12 has a forward extension portion 20 for receiving the removable chassis. The forward extension 20 has side pieces 21a and 21b sized to slidably engage the removable chassis 14 as it is moved into place. The removable chassis 14 includes a movable actuation handle 13 which is movable from a down position to an up position to move the removable chassis 14 into place. The end 26 of the actuation handle 13 is sized to fit into a notch 28a in the side piece 21a to urge the chassis 12 and 14 together, as will be explained. It will be understood that the other side of the handle 13 has an end (not shown) which fits into a slot 28b, which is identical to slot 28a. Logic chassis includes connector halves 30, 31 and 32 which mate and plug into matching connector halves 70, 71 and 33 (see FIG. 7) in the removable chassis 14, as it is seated in the logic chassis 12. The connector half 32 plugs into connector half 33, and is fully seated by a push member 40 after the handle 13 is moved to its up position, as will be explained. Connector half 30 is fixed, while connector halves 31 and 32 float. Connector half 30 is positioned in relation to an alignment pin 34, which aligns the removable chassis 14 in the horizontal direction as it is seated in logic chassis 12, as will be explained.

Figure 2:
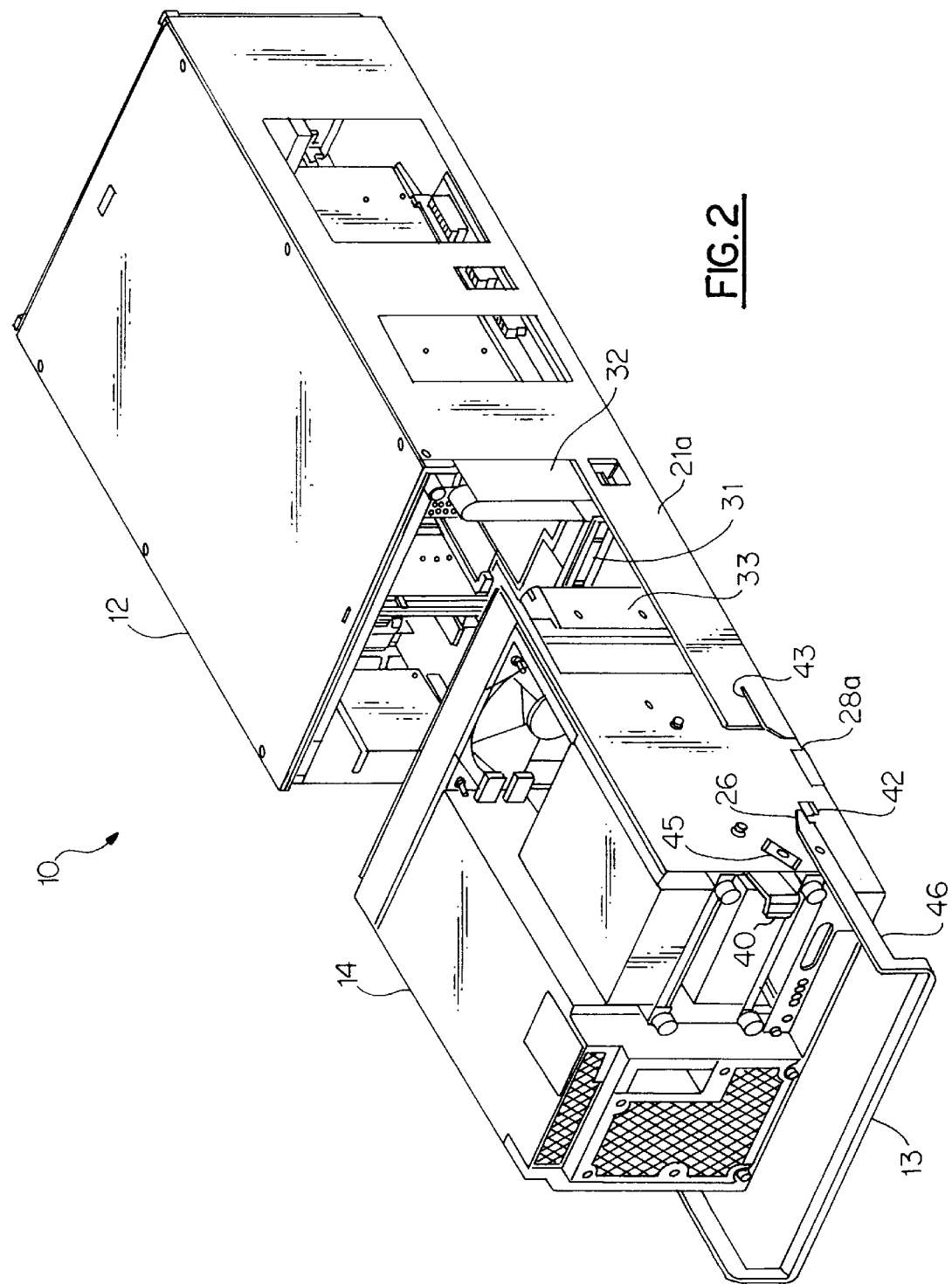
FIG. 2 is a perspective view of the node module of FIG. 1 wherein the removable chassis is partially inserted into the logic module, the removable chassis having an actuating handle in the down position.

An alignment tab 42 is formed in the side of the removable chassis 14 by bending out a cutout, as shown in FIG. 2. The side piece 21a has a slot 43 for receiving the tab 42 as the chassis 14 is seated. The tab 42 and slot 43 arrangement aligns the chassis 12 and 14 in the vertical direction. It will be understood that a like tab and slot arrangement is provided on the other side of the node module 10. Each side of the removable chassis 14 includes a friction button 45 for holding the handle 13 in its up position.

Figure 3:
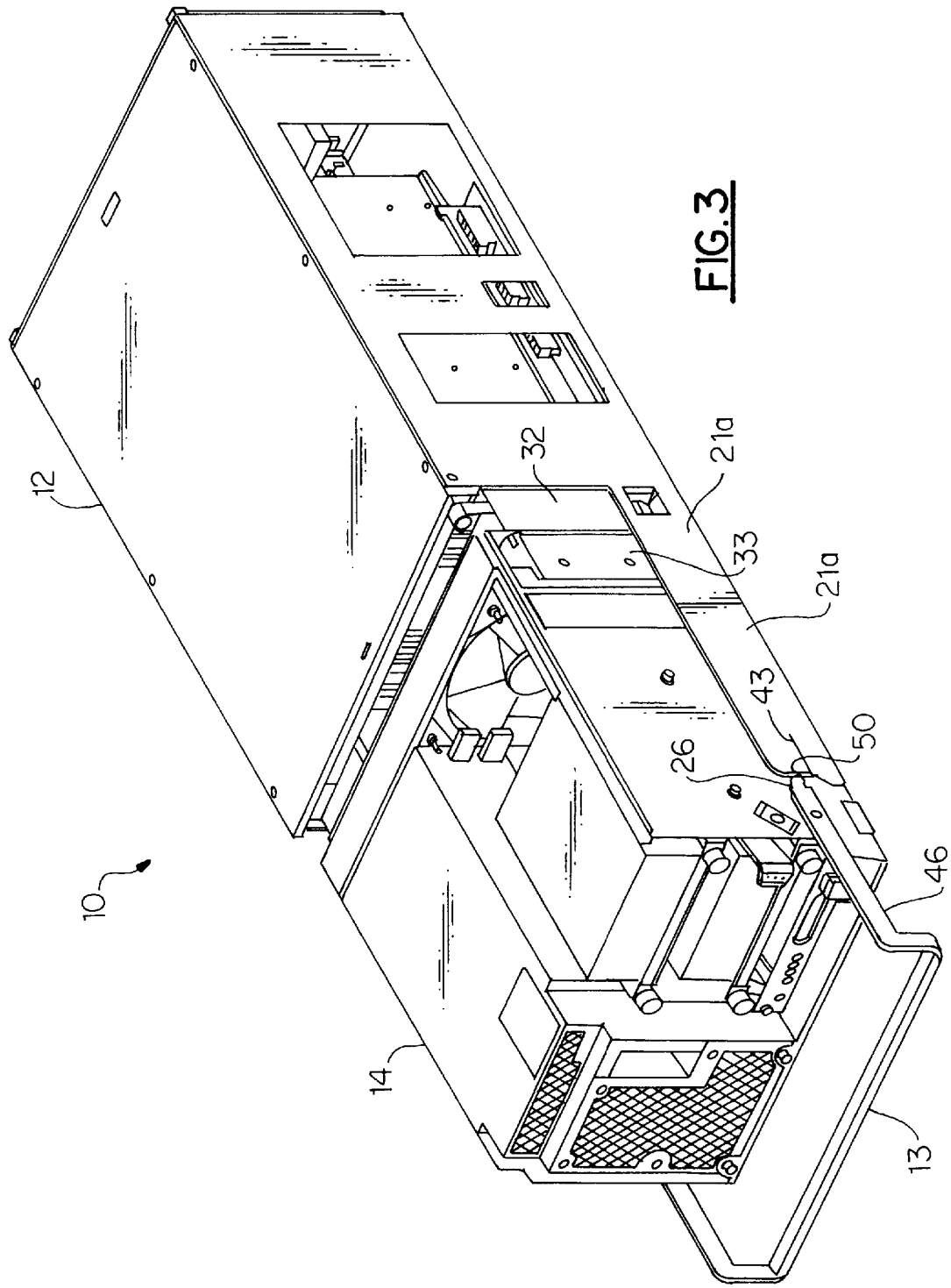
FIG. 3 is a perspective view of the node module of FIG. 1 wherein the removable chassis is moved to its first stopped position with the actuating handle in the down position.

FIG. 3 is a perspective view of the node module 10 with the removable chassis 14 moved into the logic chassis 12 to its first stop position. In the first stop position of FIG. 3, the end 26 of side 46 of the handle 13 is stopped by the face 50 of the side piece 21a. The aligning tab 42 is in the slot 43 to align the chassis 14 in chassis 12. The chassis 14 is positioned in its first stop position by end 26 striking face 43 such that the connector halves 30, 31 and 32 do not contact the mating halves 70, 71 and 33, respectively (see FIG. 7) to prevent damage to the connectors when the removable chassis 14 is initially inserted into the logic chassis 12.

Figure 4:
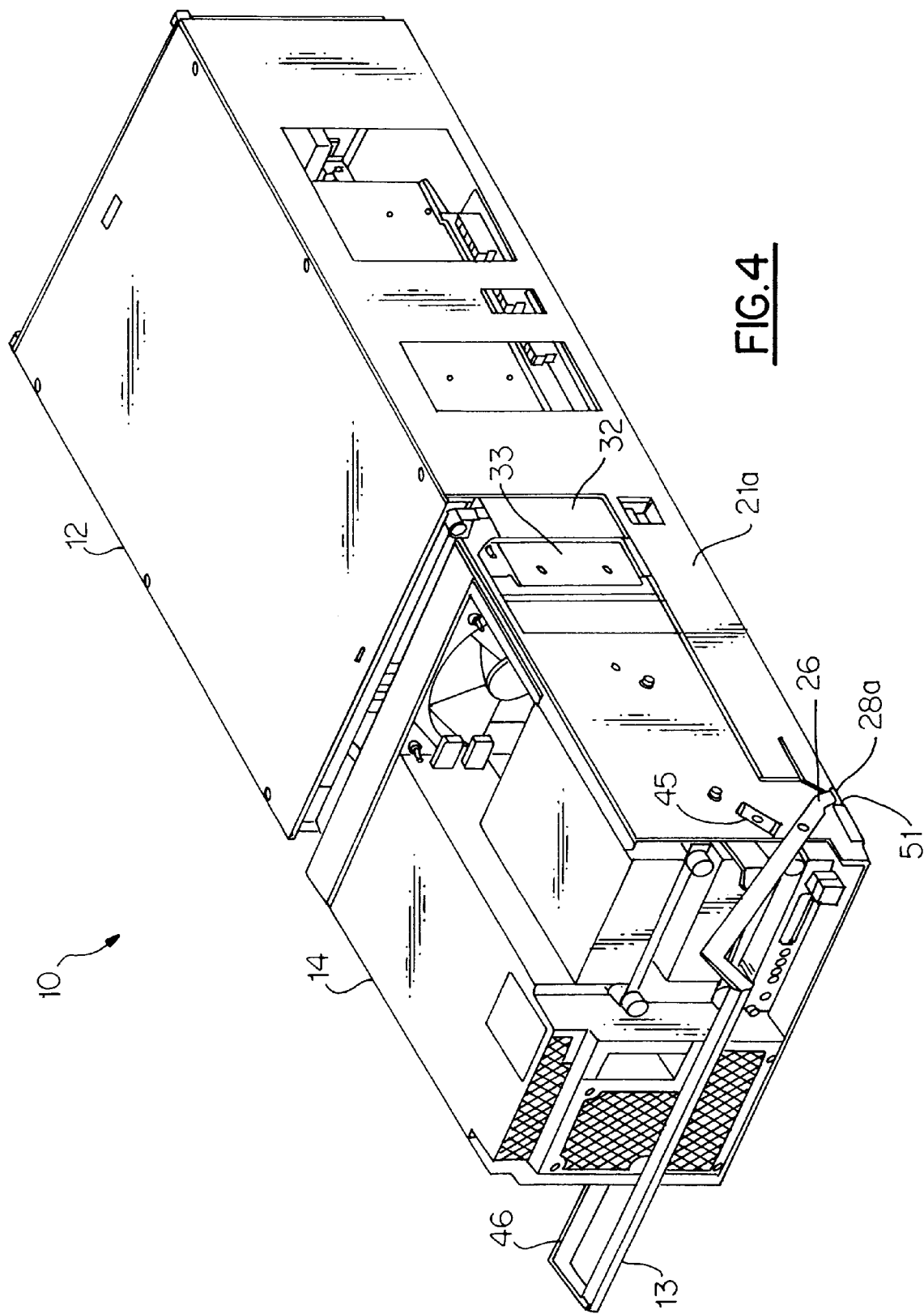
FIG. 4 is a perspective view of the node module of FIG. 1 wherein the actuating handle is in an intermediate position for camming the removable chassis into the logic module.

FIG. 4 is a perspective view of the node module 10 with the actuating handle moved toward its up position. As the handle 13 is moved up, the end 26 moves downwardly into the notch 28a, and the inner face of the end 26 engages with the face 51 of the notch 28a. As the handle 13 is moved further upwardly, the action of the end 26 in the notch 28a cams the removable chassis 14 into the logic chassis 12. As the chassis 12 and 14 are moved together, the connector halves 30 and 31 are plugged into mating connector halves 70 and 71 of FIG. 7 in the removable chassis 14. It will be remembered that connector half 31 floats. The alignment pin 34 aligns the chassis 12 and 14 in the horizontal direction, as will be explained in connection with FIG. 7, to correctly plug connector half 30 into its mating connector half 70. As connector half 31 floats, it moves to be in alignment with and plug into its mating connector half 71. Connectors 32 and 33 also begin to mate.

FIG. 5 is a perspective view of the node module 10 with the actuating handle 13 in its full up position. In the position the removable chassis 14 is fully seated in the logic chassis 12, and the connector halves 30 and 31 are fully plugged into their mating connector halves 70 and 71 in chassis 14. The handle 13 is held in its up position by the friction button 45 engaging the side pieces 46. The connector halves 32 and 33 are engaged, but not fully plugged into each other. A portion of the side of the removable chassis 14 is broken away in FIG. 5 to show a yoke piece 55 which extends from the push member 40 to the connector half 33. A pair of pins 56 and 57 are secured in the side of the removable chassis 14 to hold the yoke member 55 in place. The yoke member 55 includes a pair of slots, one of which is shown at 60 to allow limited movement of the yoke piece 55 back and forth. As the removable chassis 14 is moved into the logic chassis 12, the yoke piece 55 bottoms out at one side of the slots 60, moving the connector 33 into the connector 32. When the chassis 12 and 14 are fully seated, the connectors 32 and 33 are not fully plugged into one another. The push member 40 is then pushed, to push the yoke member 55 to the other end of the slots 60, fully plugging the connectors 32 and 33 together. The slots 60 are sized and positioned such that connector half 33 is plugged into connector half 32 sufficiently to make good electrical contact without imparting stress to the connector halves 32 and 33.

It will be understood that the sides 46 of the handle 13 are the same thickness as the thickness of the side pieces 21a and 21b, such that the cam formed by the ends 26 and the slots 28a and 28b are the same overall dimensions as the outside dimensions of the logic chassis 12. Thus, the assembled node assembly 10 does not have any protrusions, and may be slid into a rack or enclosure easily and smoothly without catching or without special alignment accommodations.

When the removable chassis 14 is to be unplugged from logic chassis 12, the handle 13 is moved downwardly. The outer face of the end 26 engages the face 52 of the slot 28a, moving the removable chassis 14 away from the logic chassis 12. As the pins 56 and 57 through the yoke member 55 are bottomed out at the other end of the slots 60, the connector half 33 is also unplugged from the connector half 32. When the handle 13 is returned to its fully down position as shown at FIG. 3, the connector halves 30, 31 and 32 are fully unplugged from connector halves 70, 71 and 33, respectively, and the removable chassis 14 may be withdrawn from the logic chassis 12.

Figure 7:
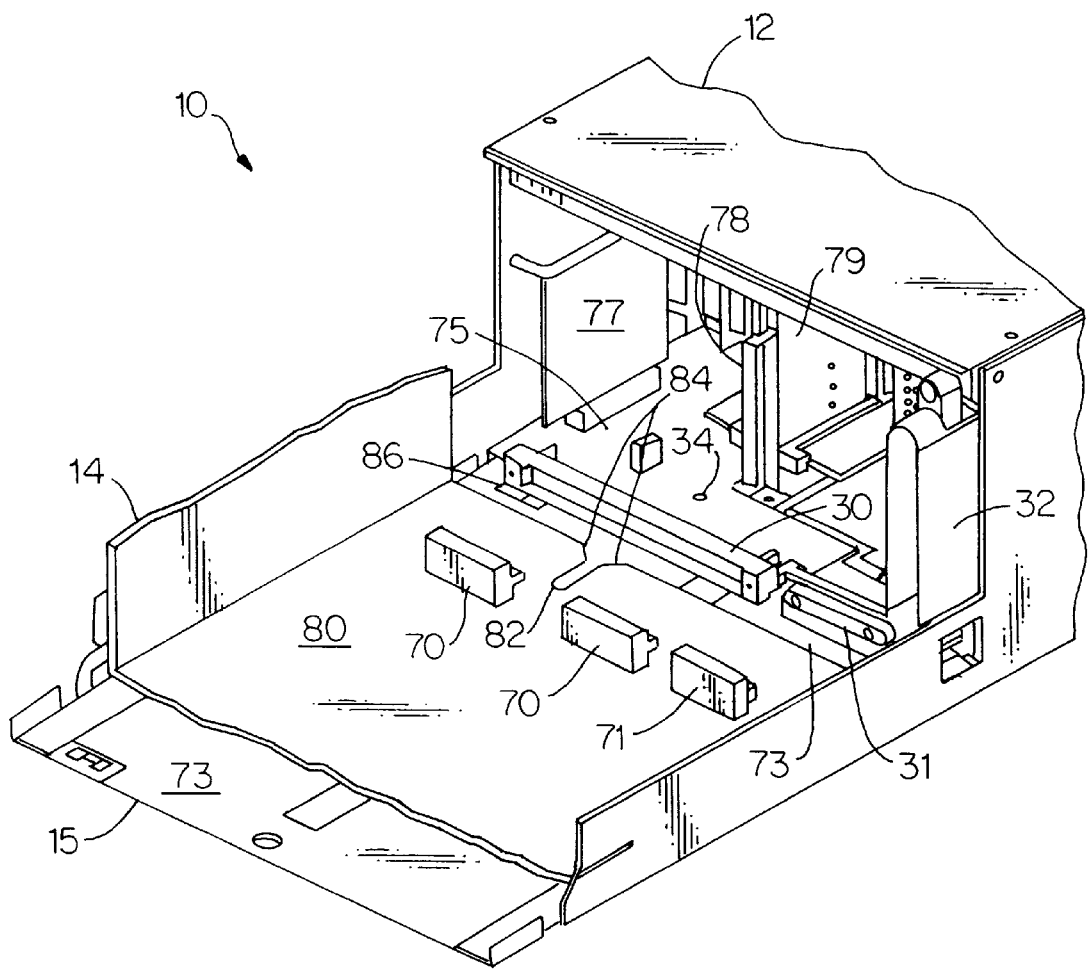
FIG. 7 is a partial perspective view of the node module of FIG. 1 showing the alignment mechanism for aligning the removable chassis in the logic chassis.

FIG. 7 is a perspective view of a portion of the node module 10 with most of the removable chassis 14 broken away. The logic chassis 12 includes a bottom member 73 which extends under the main part of the logic chassis and the forward extension 20. The mentioned motherboard 75 is elevated from the bottom 73, and is located within the logic chassis 12 for the logic boards, such as boards 77, 78 and 79, to be plugged into. There is sufficient room between the bottom 73 and the motherboard 75 for the floor 80 of the removable chassis 14 to move therebetween as the removable chassis 14 is seated within the logic chassis 12, as has been explained. The alignment pin 34 is pressed into the bottom 73 of the logic chassis, and extends between the bottom 73 and the motherboard 75. A slot 82 having flared ends 84 is provided at the leading edge of the floor 80 of the removable chassis 14 for engagement with the alignment pin 34. A portion of the connector half 70 is broken away to clearly show slot 82. It will be understood that the alignment pin 34 is used to exactly position the connector half 30, and that the slot 82 is used to exactly position the connector half 70, such that when the pin 34 is in the slot 82, the connector halves 30 and 70 are properly aligned to plug together. Clip members, such as the one shown at 86, guide the leading edge of the floor 80 under the motherboard 75 when the removable chassis 14 is cammed into place, and include spring fingers which firmly hold the floor 80 in place against the bottom 73. As mentioned previously, connector 31 floats to align itself with and plug into connector half 71 as the removable chassis 14 is seated.

While we have illustrated and described the preferred embodiment of our invention, it is to be understood that we do not limit ourselves to the precise construction herein disclosed, and the right is reserved to all changes and modifications coming within the scope of the invention as defined in the appended claims.

Having thus described our invention, what we claim as new, and desire to secure by Letters Patent is:

1. An electronic enclosure assembly comprising:
   a logic;
   a forward extension member attached to one end of said logic chassis;
   each side of said forward extension member having side pieces, each of said side pieces having a face and a notch;
   a removable chassis having a front side and a rearward side, said removable chassis sized to fit between said side pieces and be slidably movable on said extension until said rearward side comes into engagement with said logic chassis;
   an activation handle having side members pivotably attached on the sides of said removable chassis and at the front end thereof, said activation handle having an up position and a down position, each of said side members each having an end for engagement with the face of one of said side pieces, each end moving down into one of the notches of said side pieces as said activation handle is moved upwardly, each end and notch cooperating for camming said removable chassis toward said logic chassis and engaging said rearward side into engagement with said logic chassis when said activation handle is moved to its up position and for camming said removable chassis away from and disengaging said rearward side from said logic chassis when said activation handle is returned to its down position.

2. The electronic enclosure assembly of claim 1 a first connector half on said logic chassis, and a second connector half on said removable chassis, said connector halves for mating with and plugging into each other as said rearward side of said removable chassis is moved into engagement with said logic chassis.

3. The electronic enclosure assembly of claim 2 further comprising alignment means on said removable chassis and said logic chassis for aligning said removable chassis and said logic chassis such that said connector halves may mate with one another.

4. The electronic enclosure assembly of claim 3 wherein said alignment means comprises tabs on the sides of said removable chassis, and a slot in each side piece of said logic chassis for receiving one of said tabs for aligning said removable chassis in the vertical direction.

5. The electronic enclosure assembly of claim 3 wherein said alignment means comprises a bottom member in said logic chassis, a floor member in said removable chassis, an alignment pin secured in said bottom member, and an alignment slot in said floor member and at the rearward side of said removable member, said alignment slot for receiving said alignment pin for aligning said removable chassis and said logic chassis in the horizontal direction.

6. The electronic enclosure assembly of claim 3 further comprising;
   a third connector half on said removable chassis; and
   a forth connector half on said logic chassis, said forth connector half floating for allowing self aligning and mating with said third connector half as said removable chassis is moved into engagement with said logic chassis.

7. The electronic enclosure assembly of claim 3 further comprising:
   a push member on said removable chassis, said push member having a near end extending from the front side of said removable chassis and a distal end extending from the rearward side of said removable chassis;
   a fifth connector half on the distal end of said push member; and
   a sixth connector half on said logic chassis for being plugged into by said fifth connector half when said push member is pushed toward the rearward side of said removable chassis when said removable chassis is engaged with said logic chassis.

8. The electronic enclosure assembly of claim 7 further comprising drive means between said push member and said removable chassis, said drive means for partially plugging said fifth connector half in said sixth connector half when said activation handle is moved to its up position, said drive means further allowing said push member to fully plug said fifth connector half into said sixth connector half when said activation handle is in its up position, and said drive means for further unplugging said fifth connector half from said sixth connector half when said activation handle is returned to said down position.

9. The electronic enclosure assembly of claim 8 wherein said drive means comprisis:
   a yoke member between the near end and the distal end of said push member, said yoke member having a slot therein; and
   a pin in one side of said removable chassis and extending into said slot;
   the slot in said yoke member being sized and positioned to allow said pin to push said fifth connector half into mating relationship with said sixth connector half when said activation handle is in its up position, said slot in said yoke member further allowing said push member to be pushed toward the rearward end of said removable chassis thereby fully plugging said fifth connector half into said sixth connector half after said activation handle is moved to its up position, and said slot in said yoke member further causing said pin therein to unplug said fifth connector half from said sixth connector half when said activation handle is returned to its down position.

* * * * *